United States Patent
Bönig et al.

(10) Patent No.: US 12,298,258 B2
(45) Date of Patent: May 13, 2025

(54) SYSTEMS AND METHODS FOR AUTOMATED X-RAY INSPECTION

(71) Applicants: Jochen Bönig, Nuremberg (DE); Konstantin Schmidt, Nuremberg (DE)

(72) Inventors: Jochen Bönig, Nuremberg (DE); Konstantin Schmidt, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 344 days.

(21) Appl. No.: 17/884,729

(22) Filed: Aug. 10, 2022

(65) Prior Publication Data

US 2023/0050479 A1 Feb. 16, 2023

(30) Foreign Application Priority Data

Aug. 11, 2021 (EP) .................................. 21190840

(51) Int. Cl.
*G01N 23/04* (2018.01)
*G01N 23/046* (2018.01)
*G01N 23/083* (2018.01)
*G01N 23/044* (2018.01)

(52) U.S. Cl.
CPC ......... *G01N 23/046* (2013.01); *G01N 23/083* (2013.01); *G01N 23/044* (2018.02); *G01N 2223/419* (2013.01)

(58) Field of Classification Search
CPC ........ G01N 1/00; G01N 23/04; G01N 23/046; G01N 23/083; G01N 2223/401; G01N 23/18; G01N 2223/40; G01N 2223/405; G01N 2223/426; G01N 2223/1016; G06N 20/00; G06F 2119/18; G06F 2115/12; H05K 1/00; H05K 3/0002
See application file for complete search history.

(56) References Cited

U.S. PATENT DOCUMENTS 6,148,099 A 11/2000 Lee et al.
6,205,239 B1 3/2001 Lin et al.
(Continued)

FOREIGN PATENT DOCUMENTS

CN 111028224 B 12/2020
WO 2021011338 A1 1/2021

OTHER PUBLICATIONS

Ferzli, Rony, and Lina J. Karam. "No-reference objective wavelet based noise immune image sharpness metric." IEEE International Conference on Image Processing 2005. vol. 1. IEEE, 2005. pp. 1-4.
(Continued)

*Primary Examiner* — Don K Wong
(74) *Attorney, Agent, or Firm* — Lempia Summerfield Katz LLC (57) ABSTRACT

A computer-implemented method of automated X-ray inspection during the production of printed circuit board, PCB, assemblies. The method includes capturing an X-ray image of a PCB assembly, determining a first error indicator based on image processing of the captured X-ray image, determining, in case the first error indicator indicates the PCB assembly as faulty, a second error indicator based on the captured X-ray image using a trained adaptive algorithm, and outputting the second error indicator as a result of the inspection.

20 Claims, 10 Drawing Sheets

(56) References Cited

U.S. PATENT DOCUMENTS

2009/0263028 A1  10/2009  Kwon
2021/0010954 A1* 1/2021  Adler ..................... G06V 10/82

OTHER PUBLICATIONS

Kerouh, Fatma, and Amina Serir. "A no-reference blur image quality measure based on wavelet transform." In 2012 Second International Conference on Digital Information Processing and Communications (ICDIPC), pp. 127-132. IEEE, 2012.

Vu, Phong V., and Damon M. Chandler. "A fast wavelet-based algorithm for global and local image sharpness estimation." IEEE Signal Processing Letters 19.7 (2012): 423-426.

Zhang, Qianru, et al. "Deep learning based defect detection for solder joints on industrial x-ray circuit board images." In 2020 IEEE 18th International Conference on Industrial Informatics (INDIN), vol. 1, pp. 74-79. IEEE, 2020.

\* cited by examiner

Classifying (S18), by the trained adaptive algorithm, the X-ray image input into two groups — S18

FIG 14

Classifying, by the trained adaptive algorithm, the X-ray image input into three groups — S19

FIG 15

Setting a confidence level for the prediction probability of the classification of the trained adaptive algorithm — S20

↓

Classifying, by the trained adaptive algorithm, the X-ray image input into three groups — S21

↓

Manually inspecting the PCB assembly in case the confidence level is exceeded — S22

SYSTEMS AND METHODS FOR AUTOMATED X-RAY INSPECTION

CROSS REFERENCE TO RELATED APPLICATIONS

This application claims the benefit of EP21190840.5 filed on Aug. 11, 2021, which is hereby incorporated by reference in its entirety.

FIELD

Embodiments relate to systems and methods for automated x-ray inspection for electronics production.

BACKGROUND

Electronics production is prone to a multitude of possible failures along the production process. The manufacturing process of surface-mounted electronics devices (SMD) includes visual quality inspection processes for defect detection. The detection of certain error patterns like solder voids and head in pillow defects require radioscopic inspection. These high-end inspection machines, like the X-ray inspection, rely on static checking routines, programmed manually by the expert user of the machine, to verify the quality. The utilization of the implicit knowledge of domain expert(s), based on soldering guidelines, allows the evaluation of the quality. The distinctive dependence on the individual qualification significantly influences false call rates of the inbuilt computer vision routines.

The quality assessment of a covered solder joint is typically carried out by the utilization of X-ray inspection based on grayscale images. The intensity of certain areas of the image varies depending on the material being irradiated. This results in darkened image areas for metallic material accumulations. Automated evaluation of predefined image areas is carried out based on these differences in intensity. If a certain number of pixels within this area exceeds a set threshold, the area is marked as insufficient. A confirmation from the operator must be carried out. These product-specific test routines are manually created and adjusted. The current analysis methods utilized in commercially available machines are based on deterministic, rule-based systems. In industrial applications, a distinction is made between different X-ray technologies. Vertical radiography of components is referred to as 2D X-ray. X-ray, which is a cost-efficient solution with relatively short process times. Due to radiation as it passes through matter, a gray scale image (0-255) may be generated by a digital sensor, e.g., a Flat Panel Detector proffered by Omron, depending on the material and volume penetrated by the radiation. By an integrated image recognition or manual visual inspection deviations within the gray value distribution may be identified.

Due to higher packing density or double-sided assembly, more complex systems are required to ensure sufficient imaging. The unfavorable aspect ratio of PCBs requires separate 3D processes. To a certain extent, shadowing effects could be reduced by moving the component between the X-ray source and detector and reconstructing a quasi-3D image via slice images, referred to as 2.5D inspection. For further reduction of shadowing, in laminography the X-ray unit and detector are moved at an angle around the component on coplanar trajectories, with the axis of rotation oblique to the beam direction. Through multiple image acquisitions and reconstruction algorithms (e.g., Tomosynthesis), a 3D image is formed. Due to the specific setup and the small distances between the system and the component, high magnifications are possible.

For the setup of the inspection routines, a manual operation is necessary. It may be divided into two operations: definition of the Regions of Interest to be inspected and definition of the Test-procedure within the Region of Interest. For the definition of the regions of interests the operator of the software manually chooses the areas based on a sample image of the product, taken by the machine. The areas are chosen on a 2D image, pre-selected by the in-build algorithm. The selected regions of interest are the reference for the later test routine and the location is defined in reference to referential markers, also known as fiducials, located on outer corners of the circuit board. The prior art solution requires a lot of manual efforts and knowhow. For the inspection only one layer of the grayscale image is inspected, therefore information is lost.

BRIEF SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments improve inspection of PCB assemblies and reduce the number of false positives during inspection of PCB assemblies.

According to a first aspect embodiments provide a computer-implemented method of automated X-ray inspection, AXI during the production of printed circuit board, PCB, assemblies. The method includes the step of capturing an X-ray image of a PCB assembly. The method further includes the step of determining a first error indicator based on image processing of the captured X-ray image. The method further includes the step of determining, in case the first error indicator indicates the PCB assembly as faulty, a second error indicator based on the captured X-ray image using a trained adaptive algorithm. The method further includes the step of outputting the second error indicator as a result of the inspection.

According to a second aspect an embodiment is provided including a computer program including program code that when executed performs the method steps according to the first aspect.

According to a third aspect embodiments provide an inspection apparatus operative to perform the method steps according to the first aspect.

According to a fourth aspect embodiments provide a computer-implemented method of labeling X-ray images and training an adaptive algorithm. The method includes the steps of obtaining a plurality of X-ray images, a plurality of first error indicators and a plurality of labels assigned to the first error indicators, determining a false-positive of the first error indicator in case no label corresponding is assigned to the first error indicator, and training an adaptive algorithm based on the X-ray images corresponding to the first error indicators determined as a false-positive.

DETAILED DESCRIPTION

Figure 1:
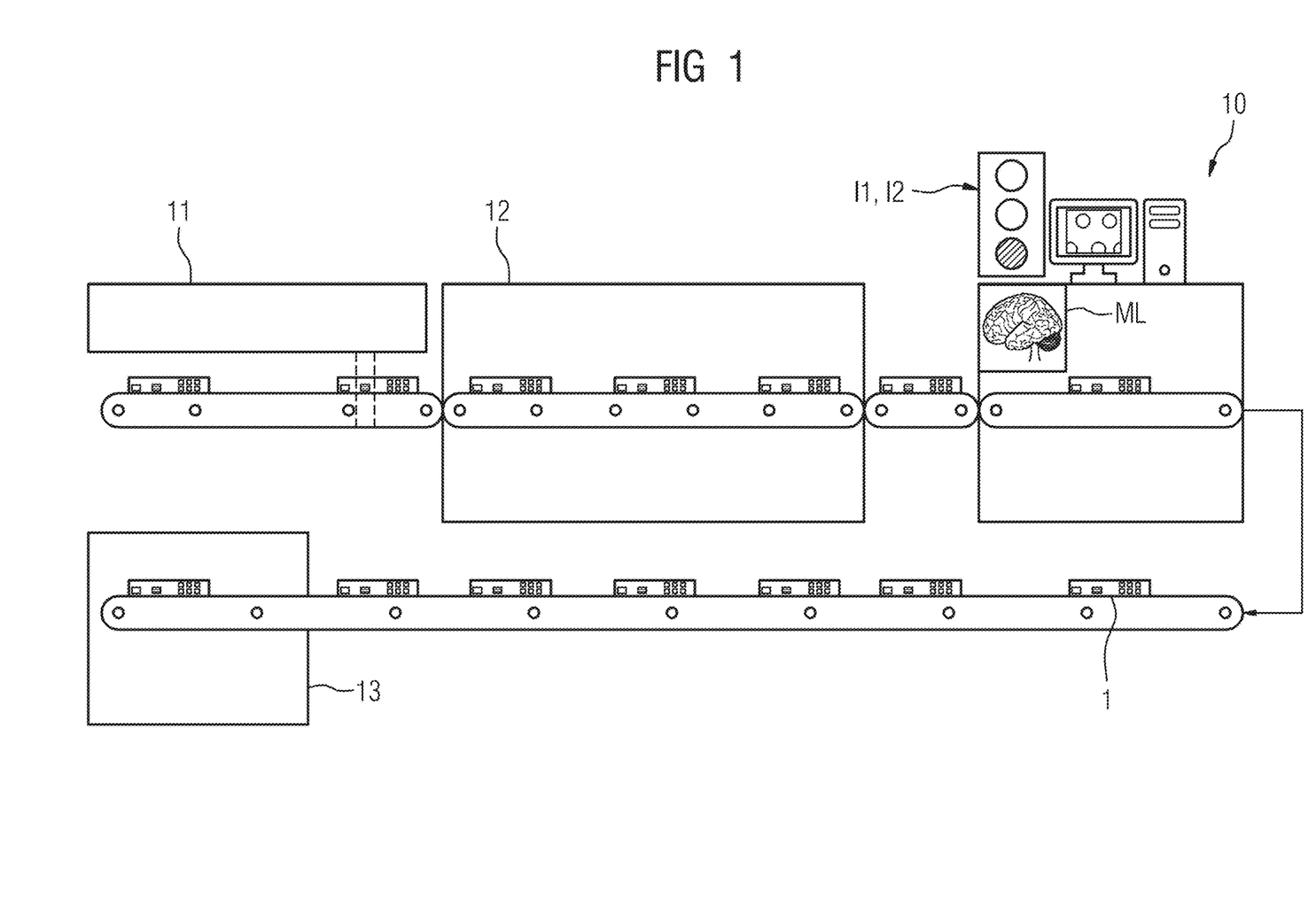
FIG. 1 depicts an illustration of a production site for producing and inspecting printed circuit board assemblies.

In electronics production, electronic components are electrically and mechanically connected to a printed circuit board, e.g., using through-hole technology (THT), as depicted in FIG. 1. In most cases, the electronic components are plugged into mounting holes on the printed circuit board at a placement location 11, such as a manual placement station or with the help of a placement robot. The printed circuit board, together with the plugged electrical components drives into a wave soldering machine 12, where it is pulled over a soldering shaft, where tin creates an electrically conductive connection between the circuit board and the electrical components. After the soldering process, the contact points (henceforth solder joints) and their characteristics are inspected by an inspection system for quality control. For this purpose, optical inspections (AOIs for short) and/or x-ray inspections (AXI for short) 10 are usually used, as depicted in FIG. 1. The inspection system 10 includes hardware components for image processing such as an X-ray source, digital sensor, computer etc. For example, such an inspection station is proffered by Omron under the denomination VT-X750. VT-X750's design employs 'Computed Tomography' (CT), providing high-precision X-ray imaging to perform precise and reliable inspection of soldered areas during production. VT-X750 inspects soldered defects such as Head in Pillow and Voids within BGA, LGA, THT and other discrete devices.

Possible defects that the inspection system 10 is supposed to detect are missing components, crooked components, solder joints with insufficient wetting (cold or open solder joints), or tin bruises, i.e., electrical contacts of solder joints, that should have electrical potential.

By way of the X-ray inspection, an X-ray image is captured via image acquisition. For example, a digital X-ray detector may be used that measures the flux, spatial distribution, spectrum, and/or other properties of X-rays.

If the image processing detects one or more errors on a printed circuit board assembly, the PCB assembly is fed via a return route to an operator O, e.g., at a diagnostic location 13, for manual inspection. Operator O on site now performs a manual (visual) inspection, e.g., via a display unit A.

In FIG. 1, the first error indicator I1, e.g., determined by (conventional) image processing or is output via a display unity, such as a traffic light system. For example, a traffic light system may be provided that outputs a first light signal, such as red, if an error has been determined by the inspection system 10. The image processing OR may assign each pixel an RGB value. In case of a grayscale image just one color-channel may be used. An RGB or grayscale threshold may then be set. Now the pixels that are either above or below the defined threshold may be counted. After this step, a sum is obtained that describes the number of pixels that exceed or fall below the threshold value. In a further step of the image processing OR, a second threshold value is defined for the sum of the pixels. If the previously formed sum of pixels exceeds or falls below the second threshold value, a faulty or error-free solder joint may be determined, respectively.

The inspection system 10 (additionally) uses a trained adaptive algorithm ML that makes it possible to reduce the effort required to (re-)program the software (modules) for image processing OR. The inspection system 10 also provides an (automatic) improvement of quality control, for example by (automatically) (re-) training of the adaptive algorithm ML. In addition, the first pass yield may be increased, e.g., by examining the solder joints, using the trained adaptive algorithm ML of the inspection system 10. For example, the original evaluation of the one or more solder joints of the PCB assembly may be overwritten. Thus, the result of the rained adaptive algorithm ML may be used instead of the result of image processing as the (overall) result of the quality inspection. A follow-up check, such as a manual inspection, of one or more printed circuit board assemblies from the inspection system 10 may become obsolete.

Alternatively, only the trained adaptive algorithm ML may be used for inspecting the PCB assembly. In that case the image processing OR is not needed or not executed. Only the error indicator of the trained adaptive algorithm is used for inspecting the PCB assembly, for example in order to determine a faulty or error-free PCB assembly. Thus, an X-ray image may be captured as before. The X-ray image may be input in the trained adaptive algorithm which returns an error indicator. The trained adaptive algorithm thus returns an error indicator based on the captured X-ray image. Determining a first error indicator based on the image processing OR is not necessary in that case. The trained adaptive algorithm may thus be used independently from the image processing OR.

The image processing OR and the adaptive algorithm ML are computer-implemented. The image processing OR and the adaptive algorithm ML are realized using program code that when executed performs the steps as described herein.

Figure 2:
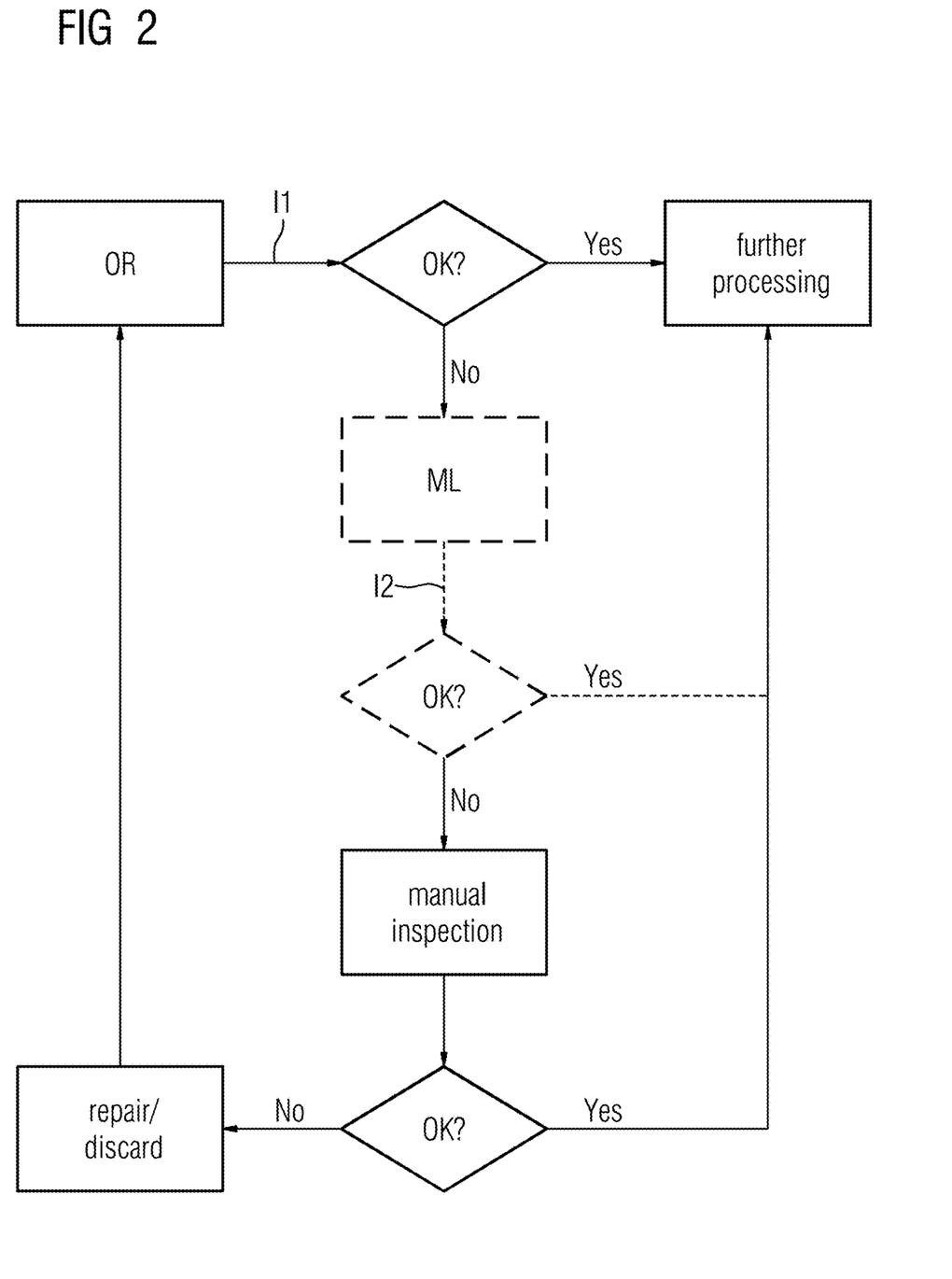
FIG. 2 depicts a diagram of an embodiment for inspecting printed circuit board assemblies.

An error indicator I1, I2 may indicate a faulty or error-free state of a PCB assembly. For example, a first error indicator I1 may be determined by image processing OR of the X-ray image and a second error indicator I2 may be determined by the adaptive algorithm ML.

Figure 3:
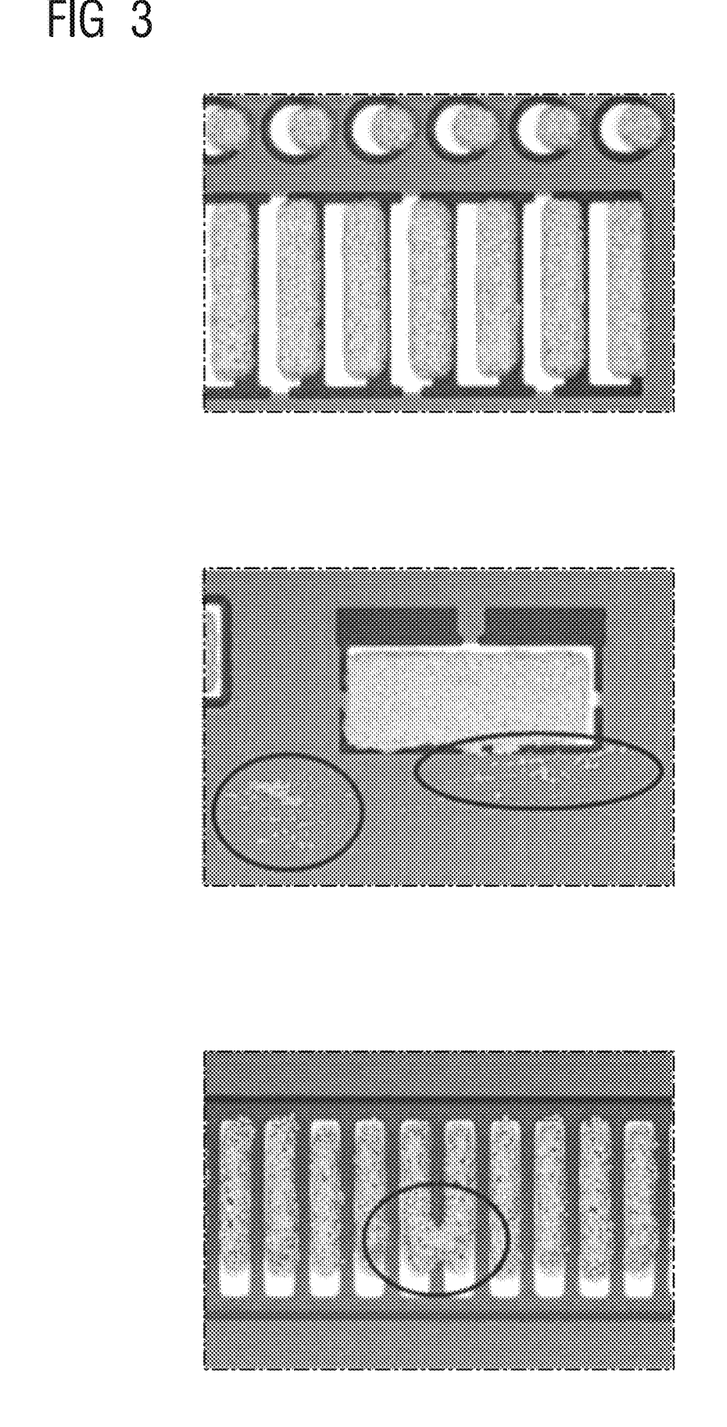
FIG. 3 depicts a fault during production and soldering of printed circuit board assemblies according to an embodiment.

Error categories and corresponding error classes may be provided for this purpose. For example, an error indicator may indicate several different faulty states, i.e., errors, of a PCB assembly. Possible errors during the production of a printed circuit board assembly are, for example: Solder paste is missing or incompletely printed, Solder paste smeared, adhesive missing or incompletely printed, adhesive smeared, component missing, component offset or twisted, gravestone effect, component reversed, color detection for MELF components, confusion test for IC/μC types, confusion test for resistance value, component reversed (IC, diode), short circuits and solder bridges (IC, μC), solder joint missing, open THT solder joint, THT solder joint, THT solder joint without contacting. In FIG. 3, a misalignment of the solder deposit, solder past smearing, and bridge formation are depicted in the order mentioned starting from the top of the FIG. 3.

Returning to FIG. 2, a value of the error indicator I1, I2 may thus indicate the detected error, also called error category. The value of the error indicator may consist of or include an alpha-numeric string of digits. Furthermore, the error indicator may describe the error in plain text, see above, or contain it in coded form.

The first error indicator may have the same or corresponding error classes or error categories as the second error indicator. In addition, it is possible that the error classes of the first error indicator are a subset of the error classes of the second error indicator, i.e., that the second error indicator also has error classes that cannot be assumed by the first error bar. In addition, there is a possibility that the first error indicator has one or more error classes that cannot be assumed by the second error indicator, i.e., which the second error indicator does not have.

The adaptive algorithm ML receives, as described, an image or one or more image areas as input and associates the image or areas to one of the error categories or to a class corresponding to the error category. An error class may thus represent one or more of the above errors. As already mentioned, the error indicator may also assume a value that indicates an error-free state of the PCB assembly.

Thus, instead of the first error indicator I1 determined by image processing, the second error indicator I2 determined by the adaptive algorithm ML may then be output. For this purpose, as described above, a display unit such as a light signal system may be provided, that indicates a first light signal, such as red, if (also) by the inspection system 10, for example by the adaptive algorithm ML, an error has been determined, or a second light signal, if no error was detected, i.e., the second error indicator I2 does not indicate an error.

If an image or one or more image areas have been evaluated using the adaptive algorithm ML, the result for the image or each image area is provided, e.g., in the form of a second error indicator I2. The output of the inspection system is thus provided using the second error indicator I2, that was determined by the adaptive algorithm ML.

For example, it may be the case that the image processing of the inspection system erroneously indicates a printed circuit board assembly as faulty, and the (trained) adaptive algorithm indicates the printed circuit board assembly as error-free. In this case, as a result of the inspection, the result of the adaptive algorithm ML may be used to avoid a (otherwise required) follow-up inspection of the printed circuit board assembly. In the event that the adaptive algorithm also detects a faulty printed circuit board assembly, a follow-up inspection of the printed circuit board is required.

In the event that image processing determines a printed circuit board assembly as error-free, the adaptive algorithm is not executed. A manual inspection by an operator is then not necessary. The printed circuit board may be further manufactured, or installation in a device housing.

For the training or re-learning of the adaptive algorithm ML, labelled images showing the error may be used. These images may form the ground truth. For the purpose of training the adaptive algorithm it is necessary that the image or image areas, also denoted as regions of interest, are assigned to the existing and defined error categories. There are various values of an error indicator that indicate a faulty or error-free state of the PCB assembly. This assignment or "labeling" may be done manually and by human expertise, e.g., by the images stored in a database and the associated error indicators generated by the diagnosis by an operator. If, for example, an image contains a certain error A (e.g., pin short circuit), this is provided with the label A. Thus, various groups of images arise. These images (groups) are referred to as ground truth data and serve as a basis for the further training steps.

In the next step, the adaptive algorithm ML is trained, for example on the basis of the images or image areas. A Deep Convolutional Neural network architecture to autonomously interpret the given visual information by the X-ray machine may be used. In this case the information given by the X-ray machine is provided in form of a 3D scan, which means that the information lies on multiple image layers which must be provided to the Neural Network. Thus, the classification of 3D X-ray images of PCB assemblies by a 3D Convolutional Neural Network is provided.

Figure 4:
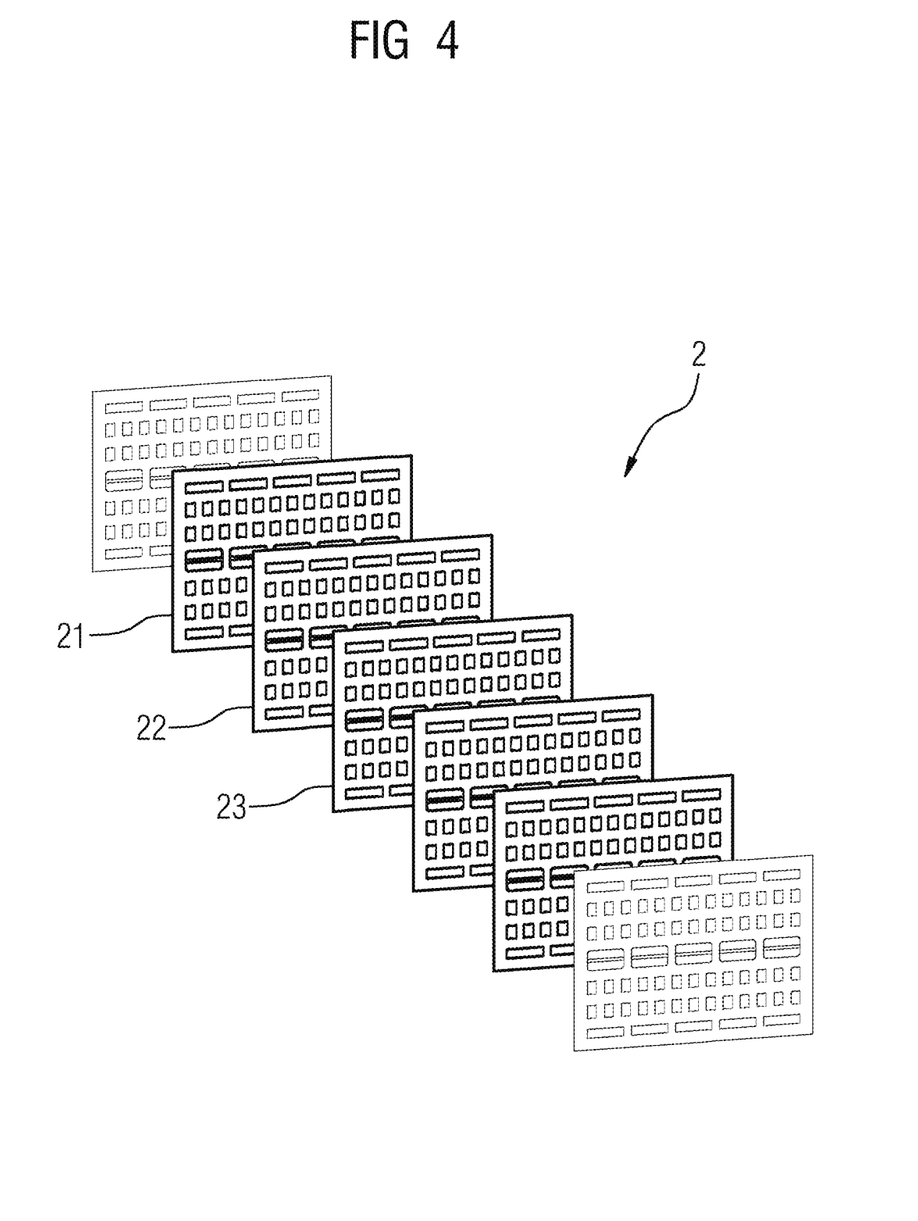
FIG. 4 depicts an X-ray image including a sequence of cross-sectional images according to an embodiment.

An X-ray image 2 may include a sequence of cross-sectional 21, 22, 23 images of the PCB assembly as depicted in FIG. 4. The X-ray image is created by electromagnetic radiation (X-rays) penetrating the PCB assembly. X-rays of varying intensity then reach a detector. The X-ray emitter or source moves to different positions, so that the printed circuit board assembly is illuminated at a variety of angles and therefore a plurality of images 21, 22, 23 is obtained. Since depending on the angle of the X-ray source different amount of mass of the PCB assembly is screened the images differ from each other. As a result, a sequence of cross-sectional images 21, 22, 23 or z-stack is obtained. The images 21, 22, 23 may be stored after a PCB assembly is scanned. The individual images of the z-stack do not distinguish in the resolution, but in their sharpness. The X-ray image 2 may be stored, e.g., in the form of a file, as a 3D-X-ray matrix or vector. The X-ray image 2 may thus include a sequence of cross-sectional images 21, 22, 23 of the PCB assembly, e.g., in the form of an image stack. The X-ray 2 image may possess a resolution in height, width, and depth, e.g., of 483×623×65, that may be stored as meta information, e.g., in the form of a separate file. The sharpness of the images steadily changes according to the order of the images in the z-stack from z=1 to z=65. This is due to the positioning and the angle change of the X-ray emitter. The sharpness of the images first rises and then falls from a certain, not fixed or definable images onwards. The image stack or sequence of cross-sectional images may thus either be used in full or in part to determine a faulty or error-free PCB assembly. As the case may be, a single image from the sequence of cross-sectional images may be determined and the inspection of the PCB assembly may be based on the single image only.

Figure 5:
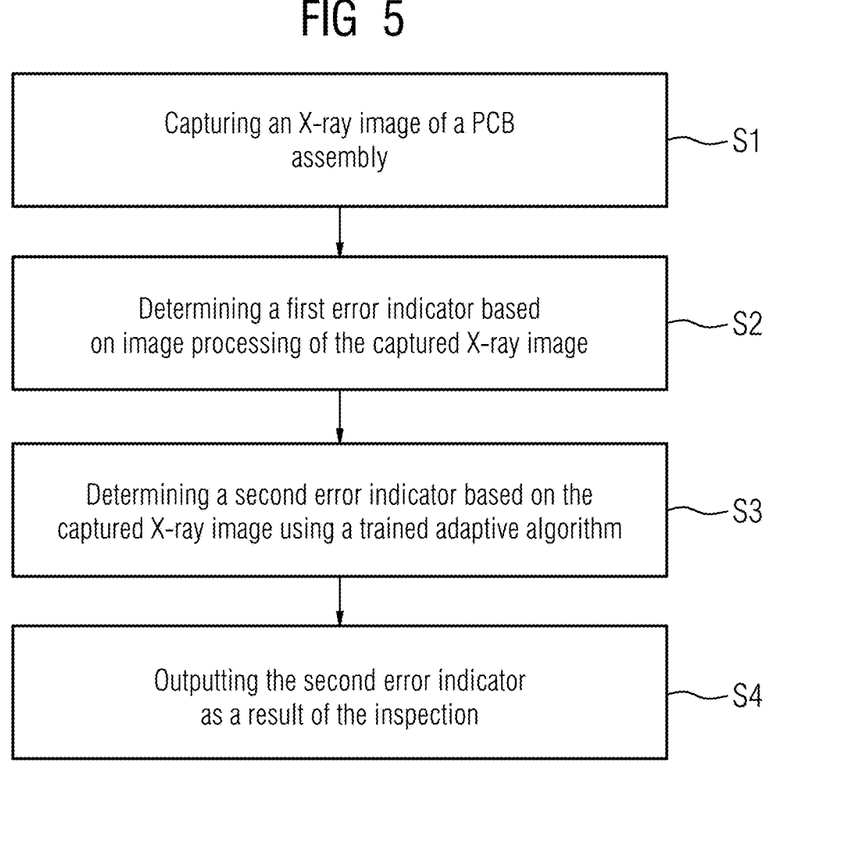
FIG. 5 depicts methods steps according to a first embodiment.

In FIG. 5 method steps are depicted. In a first step S1 an X-ray image of the PCB assembly may be captured, e.g., as described in the above.

In a step S2, a first error indicator I1 based on image processing of the captured X-ray image may be determined.

A conventional image processing based on grayscale comparison of the image's pixels may be used. The conventional image processing may for example be built in an inspection station, such as Omron's VT-X750.

To determine a false-positive of the first error indicator, a second error indicator may be determined in a step S3 based on the captured X-ray image. A trained adaptive algorithm, i.e., a machine learning model, may be used.

In a step S4 the second error indicator I2 is output as a result of the inspection. For example, the second error indicator is output in case a false-positive first error indicator I1 has been determined. The output of the inspection determines the further inspection, assembly and/or production steps of the PCB assembly 1.

The trained adaptive algorithm may be used independently from the (conventional) image processing. In such a case the inspection of the PCB assembly and/or the corresponding X-ray image solely relies on the trained adaptive algorithm. The trained adaptive algorithm may include advantageous implementations itself.

Figure 6:
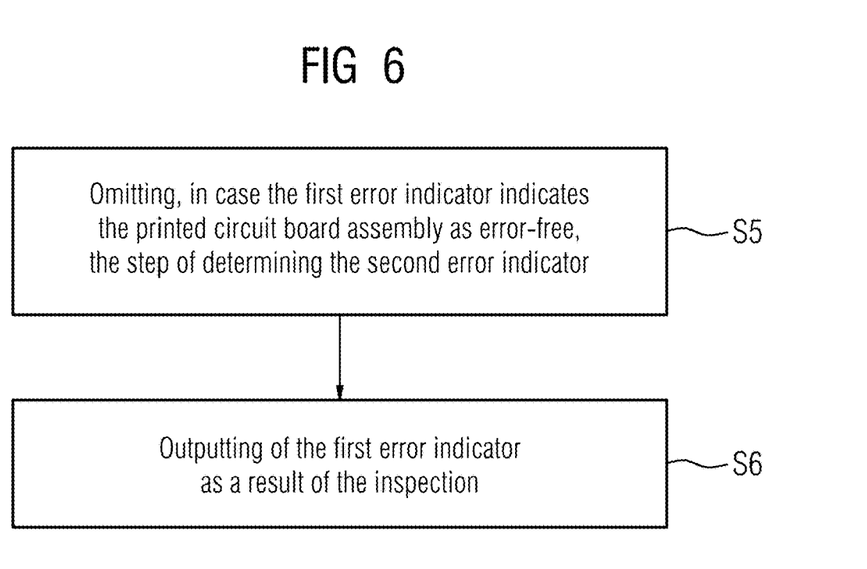
FIG. 6 depicts methods steps according to a second embodiment.

As depicted in FIG. 6, in case the first error indicator indicates the printed circuit board assembly as error-free, the step of determining the second error indicator may be omitted.

In that case, the first error indicator may be output as a result of inspection in a step S6. The PCB assembly may then be further processing, e.g., mounted in a housing of a device to be manufactured.

Figure 7:
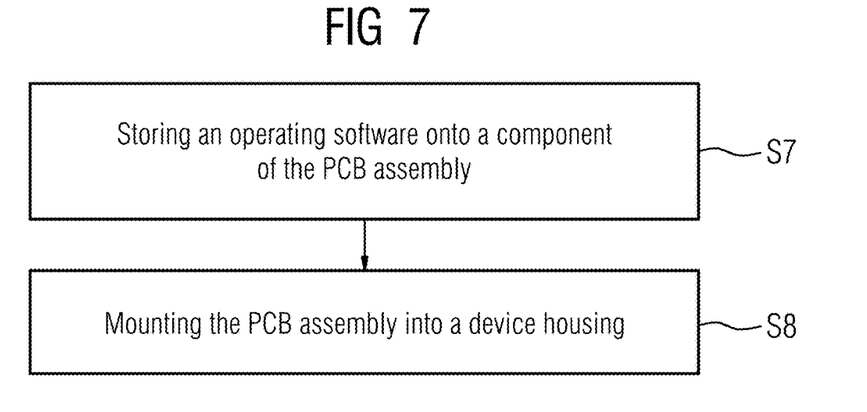
FIG. 7 depicts methods steps according to a third embodiment.

As depicted in FIG. 7, the result of the inspection may determine the further steps during the production of the PCB assembly. The inspection may be an end-of-line testing of the PCB assembly. In case the result of the inspection indicates an error-free PCB assembly further steps may be performed. Hence, in a step S7, an operating software may be stored onto a component of the PCB assembly, for example onto an integrated circuit of the PCB assembly. Additionally, or alternatively, the PCB assembly may be mounted into a housing in a step S8. For example, the housing may be a housing of an industrial PC, a programmable logic controller or a converter or any other device. The operating software stored on a component of the PCB assembly may govern the operation of the device.

Figure 8:
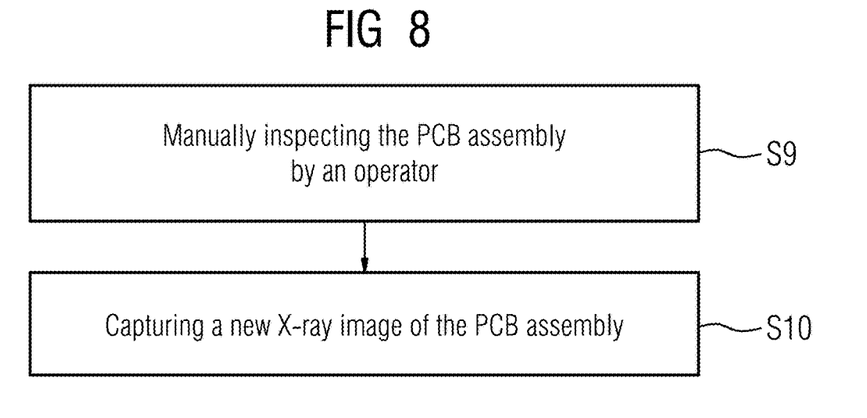
FIG. 8 depicts methods steps according to a fourth embodiment.

In FIG. 8, further method steps are depicted. After obtaining a result of the inspection of the PCB assembly, e.g., obtaining the second error indicator I2 indicating the PCB assembly as faulty, the PCB assembly and/or the corresponding X-ray image may be manually inspected in a step S9, for example by an operator. The operator may visually inspect the PCB assembly and/or the corresponding X-ray image and as result repair the assembly. Alternatively, the PCB assembly may be discarded. However, the case may appear that the second error indicator also erroneously indicates the PCB assembly as faulty. In that case the PCB assembly is further processed as described in the above in steps S7 and/or S8. In any case the PCB assembly may be subject to a new inspection and the PCB a new X-ray image of the PCB assembly may be captured in a step S10.

Figure 9:
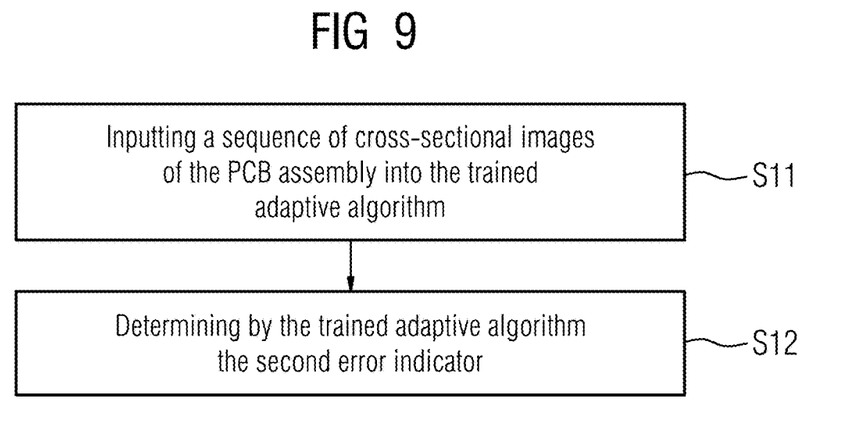
FIG. 9 depicts methods steps according to a fifth embodiment.

Now turning to FIG. 9 further method steps relating to the trained adaptive algorithm are depicted. In a step S11 the sequence of cross-sectional images of the PCB assembly may be input into the trained adaptive algorithm. As the case may be the complete sequence or image stack may be into or only a part of the image stack may be input into the trained adaptive algorithm. In a step S12, the trained adaptive algorithm then determines the (second) error indicator based on the (complete) sequence of cross-sectional images input.

Figure 10:
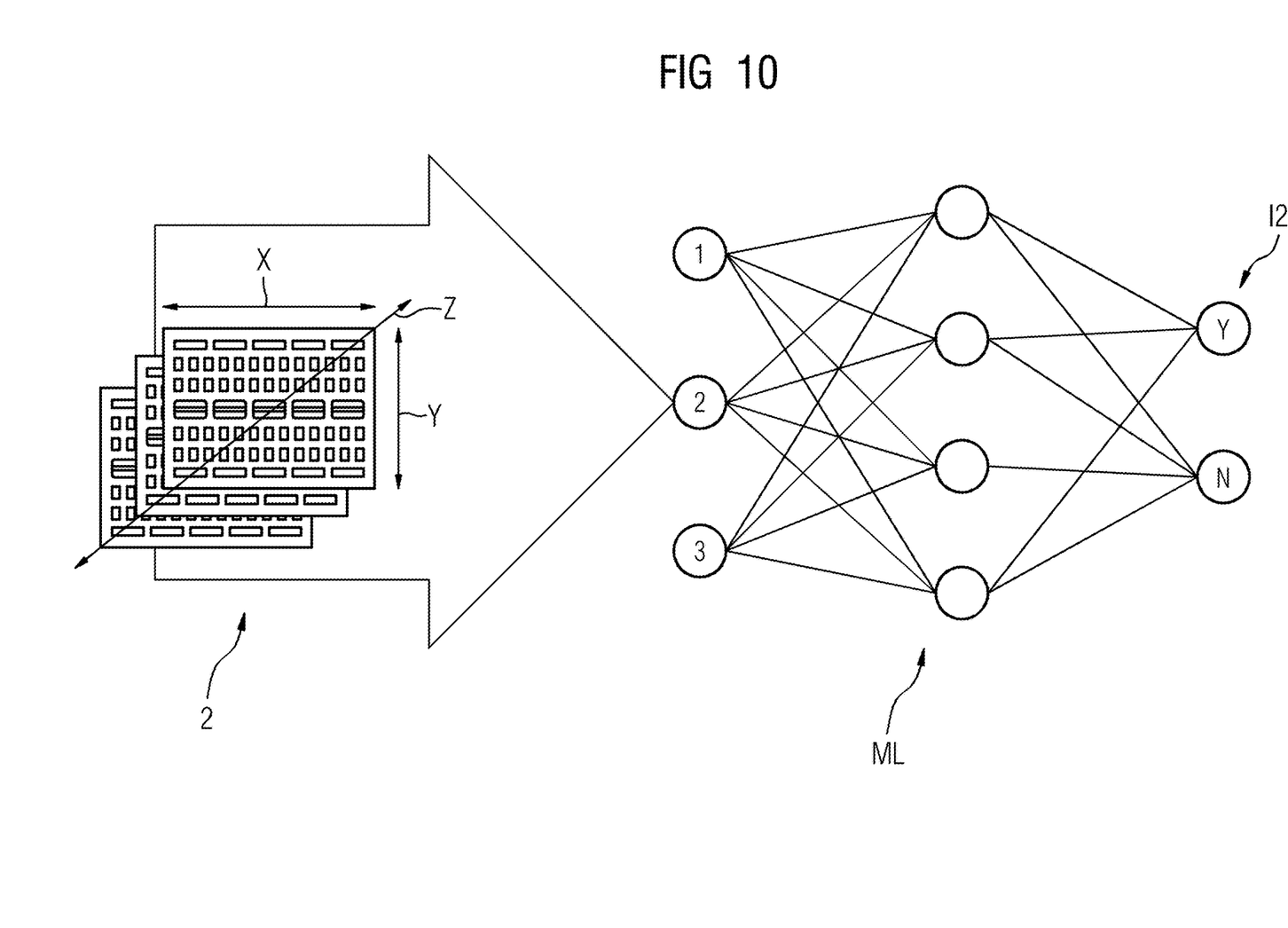
FIG. 10 depicts an illustration of an X-ray image being input into a trained adaptive algorithm according to an embodiment.

In FIG. 10, the sequence of cross-sectional images input into the trained adaptive algorithm is depicted. As depicted, the images of the image stack may have a resolution indicated by the x-axis and the y-axis. The number of the cross-sectional sequence is indicated by the z-axis in FIG. 10. The input layer of the adaptive algorithm may correspond to the number of pixels of the respective image input. A respective adaptive algorithm may be provided for each region of interest of the PCB assembly. The region of interest includes one or more solder joint(s) of the PCB assembly. The adaptive algorithm may be or may include a convolutional neural network, for example DenseNet121. The trained adaptive algorithm may then classify the images of cross-sectional sequence. The classification may correspond to the (second) error indicator I2. In an embodiment the result of the classification is either "Y" (OK) or "N" (not OK), i.e., indicating a faulty or error-free PCB assembly.

Herein, supervised learning is used to train the adaptive algorithm. As a result, a trained adaptive algorithm is obtained that predicts the quality of a PCB assembly by classifying an X-ray image. For example, a convolutional neural network may be used. A convolutional neural network includes an input layer, hidden layers, and an output layer. In any feed-forward neural network, any middle layers are called hidden because their inputs and outputs are masked by the activation function and final convolution. In a convolutional neural network, the hidden layers include layers that perform convolutions. Typically, this includes a layer that performs a dot product of the convolution kernel with the layer's input matrix. The convolution neural network may be applied to 2-dimensional or 3-dimensional space. Thus, either a single image or a plurality of image, for example one or more images from the sequence of cross-sectional images of the X-ray image, may be input into the convolutional neural network. Alternatively, another artificial neural network may be chosen. The adaptive algorithm may also be referred to as a machine learning model and the two terms may be used interchangeably herein.

Figure 11:
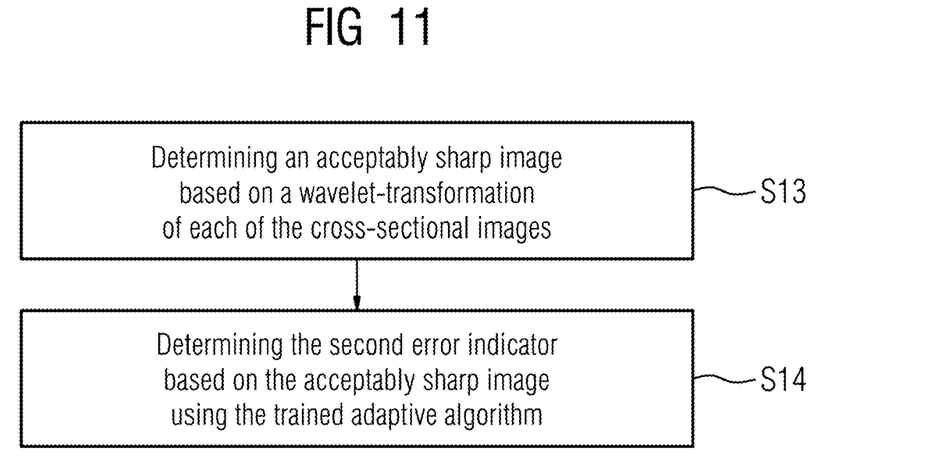
FIG. 11 depicts methods steps according to a sixth embodiment.

Now turning to FIG. 11, instead of the whole sequence of cross-sectional images only a single image or a limited number of images of the X-ray image may be used for inspecting the PCB assembly. Thus, in a step S13 an acceptably sharp image is determined based on a wavelet-transformation of each of the cross-sectional images. In this case, the sharpest image is selected because the edges in the respective image are then best visible or recognizable. Due to different influencing variables, the image sought after is not always in the same position of the sequence of images or the z-stack of images. Hence a fixed z-value cannot be used for image selection.

Each image in the sequence of cross-sectional images of the X-ray image, i.e., the z-stack, is evaluated individually and independently of other stacks or reference images by evaluating the transitions from the background over the edges to the component on the PCB assembly in each X-ray using a wavelet-transformation of the image. Using the wavelet-transformation it is possible to examine the sharpness of the images in the cross-sectional sequence. By applying the wavelet-transformation, the high frequency components, such as pixel jumps, without the background noise of the image may be filtered out. For the comparison of the individual images within a z-stack (sequence of cross-sectional images), only the high-frequency portions of the images are filtered out and the wavelet coefficients are identified. The wavelet coefficients are then added up individually for each image, so that one value per image is obtained and a comparison between the images may be performed. Using the wavelet-transformation the sharpest image from a z-stack of images may be identified, e.g., image 22 of FIG. 4. Thus, one or more images having an acceptable sharpness may be identified, e.g., using the wavelet transformation.

Accordingly, the (second) error indicator may then be determined based on the acceptably sharp image using the trained adaptive algorithm in a step S14. The trained adaptive algorithm may receive one or more images having an acceptable sharpness as input and output the (second) error indicator.

Figure 12:
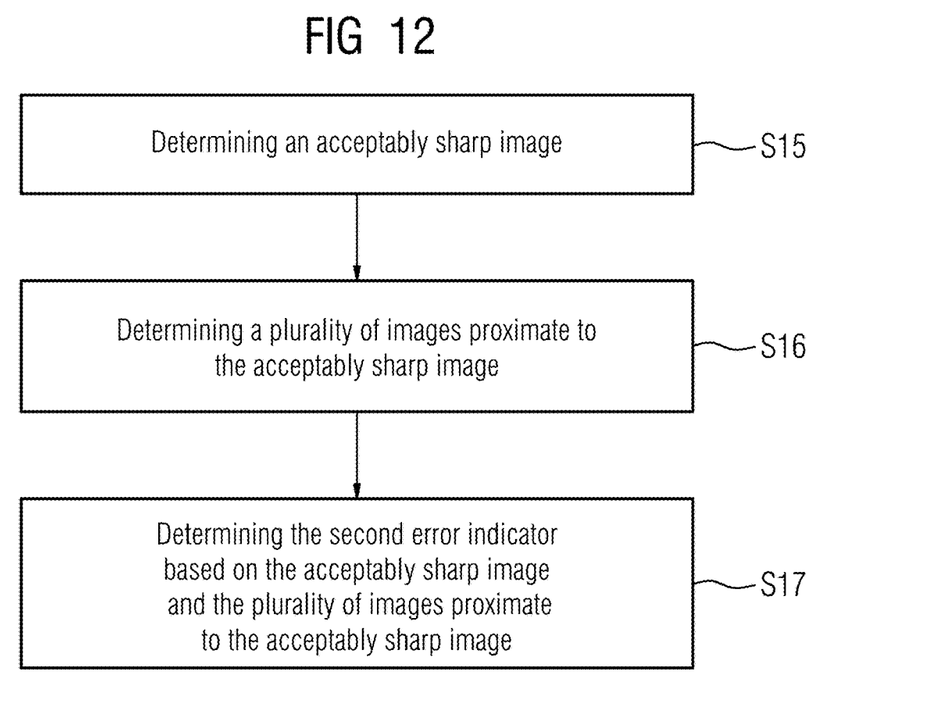
FIG. 12 depicts methods steps according to a seventh embodiment.

Now turning to FIG. 12, further method steps are depicted. As in the previous embodiment according to FIG. 11 an acceptably sharp image is determined in a step S15. In a step S15 a plurality of images proximate to the acceptably sharp image may be determined in a step S16. For example, a number of images directly adjoining the acceptably sharp image may be chosen. e.g., images 21 and 23 of FIG. 2 directly adjoin the image 22. Alternatively, a number of images having a sharpness exceeding a predetermined threshold may be chosen from the sequence of cross-sectional images.

In a step S17, the second error indicator may then be determined based on the acceptably sharp image and the plurality of images proximate to the acceptably sharp image. Alternatively, images having a sharpness exceeding a pre-determined threshold may be used for determining the second error indicator. The trained adaptive algorithm may be executed independently from the (conventional) image processing. Hence, there may not be a "first" error indicator and thus the "second" error indicator as mentioned throughout herein is just "a" error indicator determined by the trained adaptive algorithm.

Figure 13:
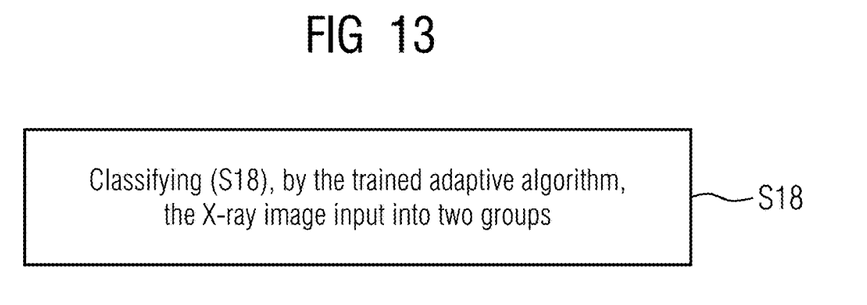
FIG. 13 depicts methods steps according to an eighth embodiment.

Turning to FIG. 13, a method step regarding the determination of the second error indicator is depicted. In a step S18 the trained adaptive algorithm may classify the X-ray image input into two groups. This is also known as binary classification. Therein one group indicates a faulty PCB assembly, and the other group indicates an error-free PCB assembly. Either the full or part of the sequence of images of the X-ray image may be used as input for the classification. Instead, a single image, i.e., with an acceptable sharpness may be used for the classification.

Figure 14:
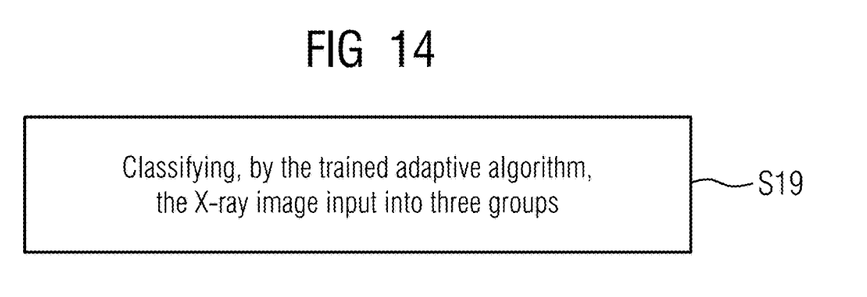
FIG. 14 depicts methods steps according to a ninth embodiment.

Turning to FIG. 14, another method step regarding the determination of the second error indicator is depicted.

The trained adaptive algorithm classifies the X-ray image input into three groups, also known as multi-class classification. Therein, a first group indicates an error-free PCB assembly, a second group indicates a first fault type of the PCB assembly, and a third group indicates a second fault type of the PCB assembly. The fault types may correspond to the one mentioned in one of the sections above. In the multiclass classification, the adaptive algorithm distinguishes between an error-free, a first type and a second type of fault, e.g., all other types of faults. For example, the first type of fault is a shape fault of a solder joint, whereas the second type of faulty may be correspond to the error rest class, i.e., all other error types.

The classification of the adaptive algorithm may determine the possible values of the second error indicator. The values of the first error indicator and the second error indicator may be the same or may differ.

Furthermore, the methods of determining a second error indicator may be combined. The full sequence cross-sectional images may be used for inspecting the PCB assembly, e.g., according to the steps as depicted in FIG. 9, and subsequently only a part of the images of the sequence of cross-sectional images or a single image may be used for inspecting the PCB assembly. The resulting error indicator may be used in order to validate the plausibility of each of the results. For example, if a faulty PCB assembly is determined by inspecting the full sequence of cross-sectional images the position of the fault may be determined by the single image inspection or the inspection of only a part of the sequence of cross-sectional images.

Figure 15:
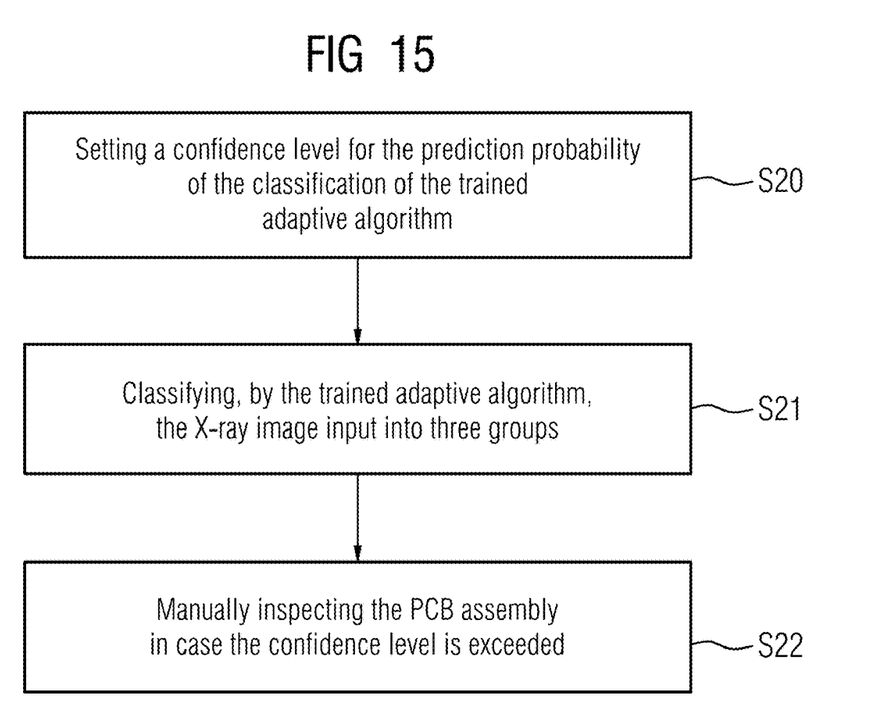
FIG. 15 depicts methods steps according to a tenth embodiment.

Turning to FIG. 15 further method steps relating to the inspection of the PCB assembly and actions depending on the result of the inspection are depicted.

In a step S20 a confidence level for the prediction probability of the classification of the trained adaptive algorithm may be set, for example by an operator, i.e., user, in a step S20. The classification by the adaptive algorithm is able to predict a probability of a classification, rather than only outputting the most likely class that the observation should belong to. Hence, the adaptive algorithm classifies the input into two, three or more groups, i.e., predicts a class and also predicts a probability of class membership.

Thus, in a step S21 the trained adaptive algorithm classifies the X-ray image input into one of the three groups. Alternatively, only two groups may be present, cf. binary classification in the above. In a step S22 the prediction probability of the classification may be obtained and may be compared to the confidence threshold set. In a step S22 the PCB assembly may be manually inspected in case the confidence level is exceeded by the prediction probability of the classification made by the trained adaptive algorithm Thereby, it is provided that a PCB assembly for which the classification only has a low prediction probability a manual inspection is performed and that no faulty PCB assemblies are further processed. Thus, the fault rate of PCB assemblies produced is further decreased.

Figure 16:
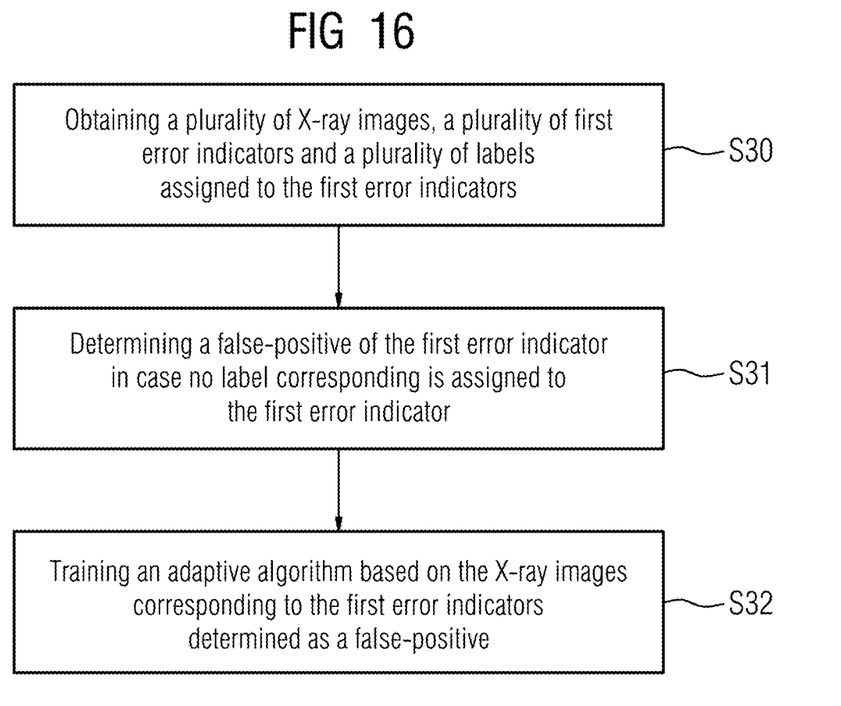
FIG. 16 depicts methods steps of labeling X-ray images and training an adaptive algorithm according to an embodiment.

Turning to FIG. 16, method steps of a computer-implemented method of labeling X-ray images and training an adaptive algorithm are depicted. In a step S30 a plurality of X-ray images, a plurality of first error indicators and a plurality of labels assigned to the first error indicators are obtained. The label refers to the quality of the PCB assembly, i.e., indicates an error-free or faulty PCB assembly. In a step S31 a false-positive of the first error indicator is determined in case no label corresponding is assigned to the first error indicator. In a step S32 an adaptive algorithm is trained based on the X-ray images corresponding to the first error indicators determined as a false-positive.

The X-ray images, the plurality of first error indicators and the plurality of labels may be stored in a database. The labels may be provided by an operator manually inspecting the PCB assemblies or corresponding X-ray images. The database contains only labels relating to a true error of the PCB assembly. Pseudo-errors, also known as false-positives, are—at first—not identified by a corresponding label in the database.

A time stamp may be associated with each of the first error indicators and the X-ray images. Another time stamp may be associated with each of the labels provided through manual inspection. Then, the first error indicators and/or corresponding X-ray images may be sorted according to their time stamps. Subsequently, each of the first error indicators and/or corresponding X-ray images may be associated with one of the labels.

The first error indicators and/or corresponding X-ray images is associated with one of the labels if a value of the time stamp of one of the labels is between the value of a time stamp of a first error indicator and a value of the time stamp of a first error indicator directly subsequent to the first error indicator.

As a consequence, one or more first error indicators and/or corresponding X-ray images may exist that have no label from a manual inspection assigned to them. This is motivated by the assumption that after capturing an X-ray image and determining a first error indicator by the (conventional) image processing only those X-ray images that have been determined to be a false-positive have no label of a manual inspection assigned to them. All other X-ray images should have a label assigned to them that the first error indicator is true positive.

Therefore, a new label is introduced that indicates a false-positive of the first error indicator. This new label is assigned to the error indicator and/or corresponding X-ray images in order to identify the false positives of first error indicator and thus the image processing performed.

The training of the adaptive algorithm may then be performed based on the X-ray images having a false-positive label assigned to them. Training of the adaptive algorithm may also include X-ray images with a true error and corresponding labeling.

Figure 17:
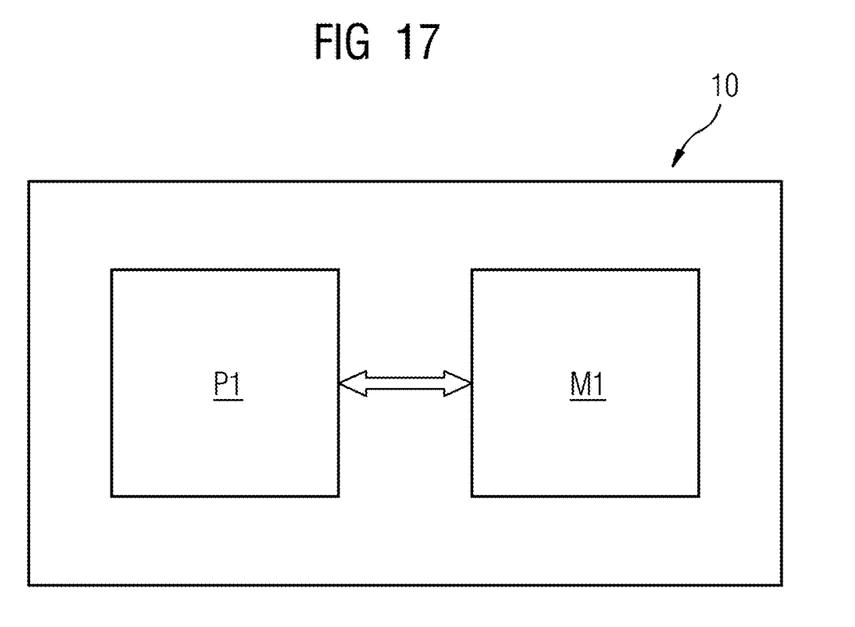
FIG. 17 illustrates an inspection system possessing a processor and a memory according to an embodiment.

FIG. 17 illustrates an inspection system including a processor P1 and a memory M1. The processor may be operative to perform one or more method steps of a computer program stored in the memory M1 of the inspection station 10. The memory including program code stored therein that when executed by the processor perform the method steps of any one or more of the embodiments described in the above.

More than one processor P1 and more than one memory M1 may be present in order to perform the method steps of any one or more of the embodiments described in the above.

The present disclosure provides systems and methods for improving the inspection of one or more PCB assemblies by reducing the number of false inspection results. Furthermore, less setup efforts and know-how are necessary for inspecting one or more PCB assemblies during or after production and/or for setting-up a grayscale image inspection. In addition, the full X-ray image, i.e., one or more or all of the sequence of cross-sectional images, may be utilized for the inspection of the one or more PCB assemblies.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that the dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A computer-implemented method of automated X-ray inspection during a production of printed circuit board (PCB) assemblies, the method comprising:
   capturing an X-ray image of a PCB assembly;
   determining a first error indicator based on image processing of the X-ray image;
   determining, after the first error indicator indicates the PCB assembly as faulty, a second error indicator based on the X-ray image using a trained adaptive algorithm; and
   outputting the second error indicator as a result of the automated X-ray inspection.

2. The method of claim 1, further comprising:
   omitting, when the first error indicator indicates the PCB assembly as error-free, the step of determining the second error indicator; and
   outputting the first error indicator as a result of inspection.

3. The method of claim 1, further comprising:
   mounting, when the second error indicator indicates an error-free PCB assembly and a false-positive first error indicator, the PCB assembly into a device housing; and
   storing an operating software onto a component of the PCB assembly.

4. The method of claim 1, further comprising:
   inspecting, when the second error indicator indicates a faulty PCB assembly, the PCB assembly by an operator; and
   capturing a new X-ray image of the PCB assembly.

5. The method of claim 1, further comprising:
   inputting a sequence of cross-sectional images of the PCB assembly into the trained adaptive algorithm, the X-ray image comprising the sequence of cross-sectional images; and
   determining by the trained adaptive algorithm the second error indicator based on the sequence of cross-sectional images.

6. The method of claim 1, further comprising:
   determining an acceptably sharp image from a sequence of cross-sectional images of the PCB assembly, the X-ray image comprising the sequence of cross-sectional images, based on a wavelet-transformation of each of the cross-sectional images; and
   determining the second error indicator based on the acceptably sharp image using the trained adaptive algorithm.

7. The method of claim 1, further comprising:
   determining an acceptably sharp image from a sequence of cross-sectional images of the PCB assembly, the X-ray image comprising the sequence of cross-sectional images, based on a wavelet-transformation of each of the cross-sectional images;
   determining a plurality of images proximate to the acceptably sharp image in the sequence of cross-sectional images; and
   determining the second error indicator based on the acceptably sharp image using the trained adaptive algorithm and the plurality of images proximate to the acceptably sharp image.

8. The method of claim 1, further comprising:
   classifying, by the trained adaptive algorithm, the X-ray image input into one of two groups, wherein a first group of the two groups indicates a faulty PCB assembly and a second group of the two groups indicates an error-free PCB assembly.

9. The method of claim 1, further comprising:
   classifying, by the trained adaptive algorithm, the X-ray image input into one of three groups, wherein a first group of the three groups indicates an error-free PCB assembly, a second group of the three groups indicates a first fault type of the PCB assembly, and a third group of the three groups indicates a second fault type of the PCB assembly.

10. The method of claim 1, further comprising:
setting a confidence level for a prediction probability of a classification of the trained adaptive algorithm; and
inspecting the PCB assembly in case the confidence level is exceeded.

11. A non-transitory computer implemented storage medium, including machine-readable instructions stored therein for automated X-ray inspection during a production of printed circuit board (PCB) assemblies, that when executed by at least one processor, cause the processor to:
acquire an X-ray image of a PCB assembly;
determine a first error indicator based on image processing of the X-ray image;
determine, after the first error indicator indicates the PCB assembly as faulty, a second error indicator based on the X-ray image using a trained adaptive algorithm; and
outputting the second error indicator as a result of the inspection.

12. The non-transitory computer implemented storage medium of claim 11, wherein the instructions further cause the processor to:
omit, when the first error indicator indicates the PCB assembly as error-free, the step of determining the second error indicator; and
output the first error indicator as a result of the automated X-ray inspection.

13. The non-transitory computer implemented storage medium of claim 11, wherein the instructions further cause the processor to:
instruct a device to mount, when the second error indicator indicates an error-free PCB assembly and a false-positive first error indicator, the PCB assembly into a device housing; and
store an operating software onto a component of the PCB assembly.

14. The non-transitory computer implemented storage medium of claim 11, wherein the instructions further cause the processor to:
inspect, when the second error indicator indicates a faulty PCB assembly, the PCB assembly by an operator; and
acquire a new X-ray image of the PCB assembly.

15. The non-transitory computer implemented storage medium of claim 11, wherein the instructions further cause the processor to:
input a sequence of cross-sectional images of the PCB assembly into the trained adaptive algorithm, the X-ray image comprising the sequence of cross-sectional images; and
determine by the trained adaptive algorithm the second error indicator based on the sequence of cross-sectional images.

16. The non-transitory computer implemented storage medium of claim 11, wherein the instructions further cause the processor to:
determine an acceptably sharp image from a sequence of cross-sectional images of the PCB assembly, the X-ray image comprising the sequence of cross-sectional images, based on a wavelet-transformation of each of the cross-sectional images; and
determine the second error indicator based on the acceptably sharp image using the trained adaptive algorithm.

17. The non-transitory computer implemented storage medium of claim 11, wherein the instructions further cause the processor to:
determine an acceptably sharp image from a sequence of cross-sectional images of the PCB assembly, the X-ray image comprising the sequence of cross-sectional images, based on a wavelet-transformation of each of the cross-sectional images;
determine a plurality of images proximate to the acceptably sharp image in the sequence of cross-sectional images; and
determine the second error indicator based on the acceptably sharp image using the trained adaptive algorithm and the plurality of images proximate to the acceptably sharp image.

18. The non-transitory computer implemented storage medium of claim 11, wherein the instructions further cause the processor to:
classify, by the trained adaptive algorithm, the X-ray image input into one of two groups, wherein a first group of the two groups indicates a faulty PCB assembly and a second group of the two groups indicates an error-free PCB assembly.

19. A computer-implemented method of labeling X-ray images and training an adaptive algorithm, the method comprising:
obtaining a plurality of X-ray images, a plurality of first error indicators, and a plurality of labels assigned to the plurality of first error indicators,
determining a false-positive of the plurality of first error indicators in case no label corresponding is assigned to a respective first error indicator, and
training an adaptive algorithm based on the X-ray images corresponding to the plurality of first error indicators determined as a false-positive.

20. The computer-implemented method of claim 19, further comprising:
capturing an X-ray image of a PCB assembly;
determining a first error indicator based on image processing of the captured X-ray image;
determining, the first error indicator indicates the PCB assembly as faulty, a second error indicator based on the captured X-ray image using the trained adaptive algorithm; and
outputting the second error indicator.

* * * * *